(12) United States Patent
Braune et al.

(10) Patent No.: US 7,345,413 B2
(45) Date of Patent: Mar. 18, 2008

(54) COATED LUMINESCENT MATERIAL AND LIGHT-EMITTING DEVICE HAVING SUCH A LUMINESCENT MATERIAL

(75) Inventors: Bert Braune, Wenzenbach (DE); Martin Zachau, Geltendorf (DE); Franz Zwaschka, Ismaning (DE)

(73) Assignees: Patent-Treuhand-Gesellschaft für elektrische Glühlampen mbH, München (DE); Osram Opto Semiconductors GmbH, Regensburg (DE)

( * ) Notice: Subject to any disclaimer, the term of this patent is extended or adjusted under 35 U.S.C. 154(b) by 310 days.

(21) Appl. No.: 10/774,626

(22) Filed: Feb. 9, 2004

(65) Prior Publication Data

US 2004/0166038 A1    Aug. 26, 2004

(30) Foreign Application Priority Data

Feb. 20, 2003  (DE)  ................................. 103 07 283

(51) Int. Cl.
*C09K 11/02*  (2006.01)
*H05B 33/14*  (2006.01)

(52) U.S. Cl. ...................... 313/489; 313/486; 313/487; 313/512; 313/570; 313/572

(58) Field of Classification Search .................... None
See application file for complete search history.

(56) References Cited

U.S. PATENT DOCUMENTS

| 5,998,925 | A | 12/1999 | Shimizu et al. | |
| 7,045,956 | B2* | 5/2006 | Braune et al. | 313/512 |
| 2002/0105266 | A1* | 8/2002 | Juestel et al. | 313/512 |
| 2002/0149001 | A1 | 10/2002 | Ellens et al. | |
| 2003/0146690 | A1* | 8/2003 | Ellens et al. | 313/503 |
| 2004/0166320 | A1* | 8/2004 | Kobusch | 428/404 |

FOREIGN PATENT DOCUMENTS

WO    WO 01/93341 A1    12/2001

* cited by examiner

*Primary Examiner*—Ashok Patel
(74) *Attorney, Agent, or Firm*—Cohen Pontani Lieberman & Pavane LLP

(57) ABSTRACT

A coated luminescent material having a luminescent material powder formed by grains, the luminescent grains being coated, and the coating being at most 5 nm, preferably at most 2 nm.

13 Claims, 1 Drawing Sheet

COATED LUMINESCENT MATERIAL AND LIGHT-EMITTING DEVICE HAVING SUCH A LUMINESCENT MATERIAL

FIELD OF THE INVENTION

The invention relates to a coated luminescent material having a luminescent material powder formed by grains, the luminescent grains being coated. It is, in particular, a luminescent material for use in a heavy-duty environment, especially in an LED or lamp. The invention furthermore relates to a light-emitting device which contains this luminescent material.

BACKGROUND OF THE INVENTION

US 2002/105266, in which a LED and a luminescent layer of coated particles are used, has already disclosed a coated luminescent material. Several ways of producing the coated luminescent material are described therein, but these are all methods based on wet chemical precipitation or on CVD.

SUMMARY OF THE INVENTION

It is an object of the present invention to provide a coated luminescent material having a luminescent material powder formed by grains, the luminescent grains being coated, such that the luminescent material is stabilized both against degradation when the luminescent material is being processed and during the operation of a device that contains the luminescent material. It is also an object to provide such a device.

The first object is achieved by a luminescent material wherein the layer thickness of the coating is at most 5 nm and, in particular, is less than or equal to 3 nm. The further object is achieved by a light-emitting device, having at least one radiation source which emits essentially within the range of from 150 to 600 nm, and a luminescent layer which converts the light from the light source at least partially into longer-wave radiation, the luminescent layer being formed by particles which are coated, wherein the layer thickness of the coating is at most 5 nm and, in particular, is less than or equal to 3 nm.

Particularly advantageous refinements can be found in the dependent claims.

The proposed stabilization facilitates introduction of the luminescent material into a device, especially a light-emitting device. The basic idea is to for hydrophilic luminescent particles to be rendered hydrophobic by means of the coating.

Customary methods to date for applying protective layers to the surface of luminescent particles have used wet chemical precipitation or CVD. These methods can only be carried out with great complexity, and are expensive. Furthermore, many luminescent materials cannot be protected by these methods because they are not stable enough for a chemical method, or the heat treatment necessary for this, or because they are unsuitable for a fluidized bed method owing to the size, shape or distribution of their grains.

Now, the coated luminescent grains are preferably produced by a wet chemical treatment, with the hydrophobic groups of the coating material binding, for the first time, to the surface of the luminescent grain by chemical bonds. The luminescent grains therefore become hydrophobic by a chemical reaction, which leads to surface-bound hydrophobic groups, the following substance classes having been found to be suitable for the coating:

alkylsilyl halides, in particular of the type $R_2SiX_2$ with R=alkyl and X=Cl or Br;
arylsilyl halides, in particular of the type $Ar_3SiX$ or $Ar_2SiX_2$, where Ar=phenyl in particular;
phenyl-substituted silicon alkoxides;
alkyl halides of the type R—X;
acyl halides of the type

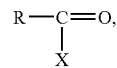

in each of which: R=aliphatic residue and X=halogen, preferably Cl or Br.

These are molecular layers, which are hence at most 5 nm thick. Characteristic of the layers are the outward-pointing hydrophobic groups. The individual materials referred to above may also be combined for this, an example being reagents containing phenyl and methyl groups.

This encapsulation coating leads both to protection against moisture and other quality-reducing effects, and to a hydrophobic surface which improves introduction of the luminescent materials into hydrophobic media, for example the epoxy resin of an LED. A positive effect on the rheology of the powder is also encountered. This is helpful for powder processing, for example the flowability in machine delivery systems, or for the fluidization in a subsequent CVD process. Subsequent processing of the hydrophobic surface is possible, for example using a second layer. A positive effect is encountered, in particular, as a fluidization aid for electroluminescent materials.

The layer thicknesses may preferably lie in the range of from sub-nanometer fractions to a few nanometers. A layer thickness of from 0.1 to 2 nm is preferred.

In a particularly preferred embodiment, a second layer of agglomerated nanoparticles, which are preferably produced by flame hydrolysis, is built up on the first layer. The adhesion of the second layer is very substantially promoted by the prior binding of hydrophobic groups to the grain surface (the first layer) via chemical bonds. The first layer acts essentially as an adhesive foundation for the second layer. The hydrophobic properties are further improved by the second layer.

Examples of these luminescent materials are moisture-sensitive luminescent materials with a hydrophilic surface for use in LEDs, for example a chlorosilicate such as chlorosilicate:Eu which is known per se, or chlorosilicate: Eu,Mn as known from WO 01/93341, or thiogallates as known from US 2002/149001. This can be damaged by moisture and heat during processing, especially by diffusion of moisture into the resin in the presence of blue radiation or UV radiation, as are commonly used for primary emission of an LED in the operation of such a device. Introduction of the hydrophilic luminescent materials into a hydrophobic resin furthermore leads to agglomeration and increased sedimentation. The peak wavelength of the primary-emitting chips of such LEDs lies at 300 to 490 nm; in particular, blue is intended here to mean a peak wavelength of from 425 to 490 nm and UV is intended to mean a peak wavelength of from 300 to 420 nm.

The invention may moreover be used in principle for many other luminescent materials, such as sulfides or garnets. Apart from LED luminescent materials, for which there is a particular stabilization requirement, the invention may also be used, by way of example, for luminescent materials of high-pressure discharge lamps such as Hg high-pressure lamps, which essentially emit having the maximum in the range from 200 to 490 nm. Typical luminescent materials are vanadates such as yttrium vanadate, which can be fluidized better with the coating according to the invention. A wider field involves VUV luminescent materials, which interact with an excimer discharge device that emits essentially having its maximum in the range of from 150 to 320 nm. One example of this is the Xe excimer discharge, for which VUV-BAM is used. Hydrophobic surfaces are often of particular interest in this case for slurrying or coating based on solvents.

Specific examples of luminescent materials which are suitable for the coating are garnets such as YAG:Ce, TbAG:Ce, or garnets of other rare earths such as Gd, Lu or La, as well as chlorosilicates and thiogallates, for example thiogallate containing Mg, and nitridosilicates, or SCAP. These luminescent materials often contain rare earths as constituents.

BRIEF DESCRIPTION OF THE DRAWINGS

The invention will be explained in more detail below with the aid of several exemplary embodiments.

DETAILED DESCRIPTION OF THE DRAWINGS

Figure 1:
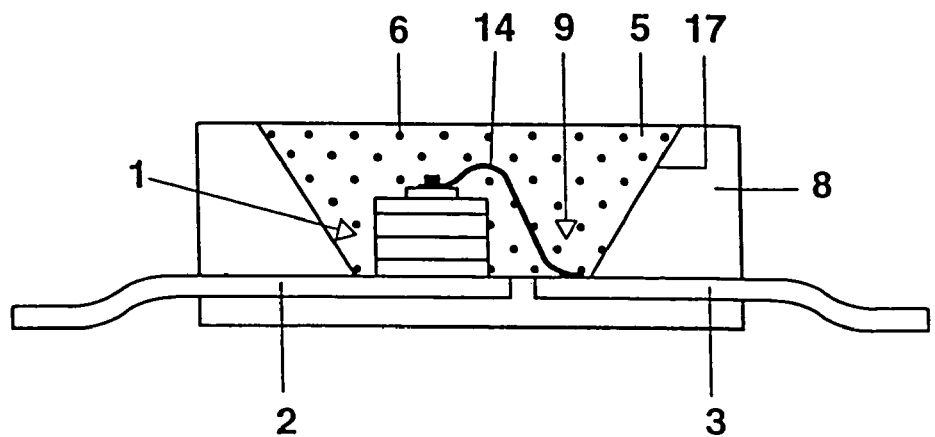
FIG. 1 shows a semiconductor component which is used as a light source (LED) for white light.

For use in a white LED together with a GaInN chip, for example, a structure similar to that described in U.S. Pat. No. 5,998,925 is employed. The structure of such a light source for white light is explicitly shown in FIG. 1.

The light source is a semiconductor component (chip 1) of the InGaN type with a peak emission wavelength of 460 nm, which has a first electrical terminal 2 and a second electrical terminal 3 and is embedded in the vicinity of a recess 9 in an optically opaque base package 8. One of the terminals 3 is connected to the chip 1 by a bonding wire 14. The recess has a wall 17, which is used as a reflector for the blue primary radiation of the chip 1. The recess 9 is filled with a potting compound 5, which contains an epoxy casting resin (80 to 90% by weight) and luminescent pigments 6 (less than 15% by weight) as its main constituents. Further small proportions are made up, inter alia, of Aerosil. The luminescent pigments are a mixture of several pigments, for example garnets.

Figure 2:
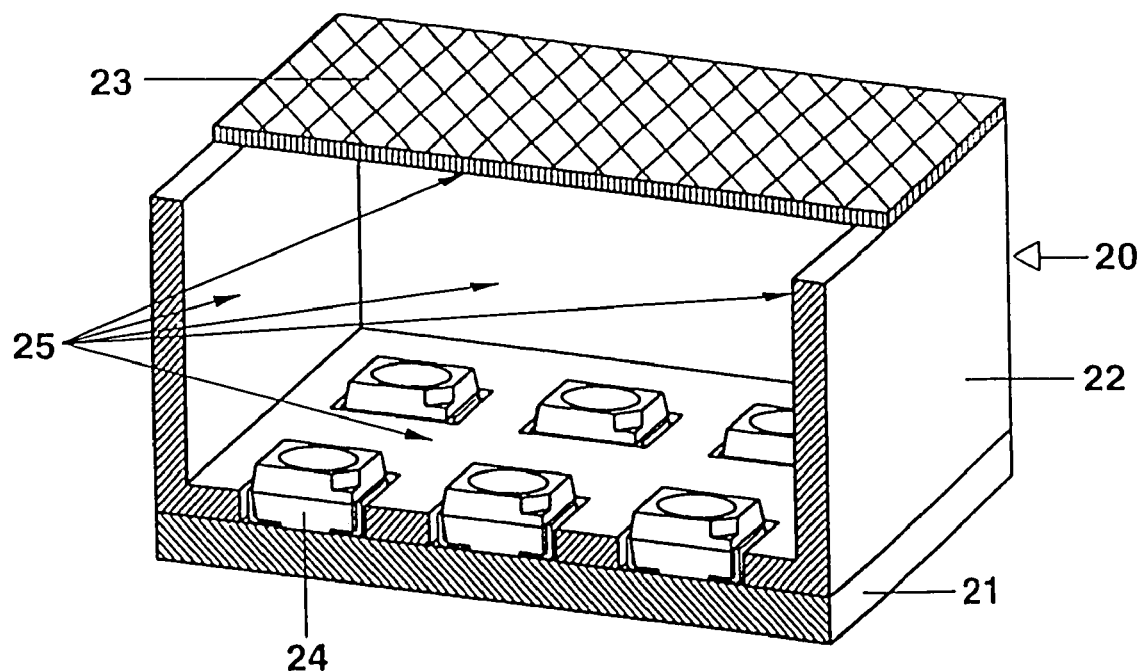
FIG. 2 shows a lighting unit having luminescent materials according to the present invention.

FIG. 2 shows a detail of a flat lamp 20 as a lighting unit. It consists of a common support 21, which is adhesively bonded onto a square-shaped outer housing 22. Its upper side is provided with a common cover 23. The square-shaped housing has holes, in which individual semiconductor components 24 are fitted. They are UV-emitting light-emitting diodes with a peak emission of 380 nm. The conversion into white light is carried out by means of conversion layers which lie directly in the casting resin of the individual LED, in a similar way to that described in FIG. 1, or layers 25 which are applied on all the faces accessible to the UV radiation. These include the inner-lying surfaces of the side walls of the housing, of the cover and of the bottom part. The conversion layers 25 consist of three luminescent materials, which emit in the yellow, green and blue spectral ranges by using the luminescent materials according to the invention. As an alternative, a blue-emitting LED array may also be used, in which case the conversion layers may consist of one or more luminescent materials according to the invention, in particular luminescent materials that emit in the yellow, green and red spectral ranges.

The luminescent materials according to the invention are, for example, chlorosilicates of the $Ca_{8-x-y}Eu_xMn_yMg(SiO_4)_4Cl_2$ type with $0 \leq y \leq 0.06$, which are stabilized by an approximately 1 nm thick coating with $Me_3Si$ groups. A second layer, approximately 50 nm thick, of hydrophobic Aerosil R 812 is applied on top. The result is substantially improved fluidization of the coated luminescent material. Clogging of the luminescent material no longer takes place in the reactor. $Me_3Si$ groups preferably act as an adhesive foundation here. The maintenance improvement is at least 5% after a running time of 1000 hours at 80° C. and 80% relative humidity. The improved homogeneity of the distribution and the improved dispersibility are furthermore to be noted.

A second example is a coating with $Me_2Si$ groups, with a typical layer thickness of about 1 to 3 nm as the only layer, which does not impair the quantum efficiency of the chlorosilicate and, under certain circumstances, even increases it slightly by up to 2%.

The invention claimed is:

1. A light-emitting device, having at least one radiation source which emits essentially within the range of from 150 to 600 nm, and a luminescent material which converts the light from the radiation source at least partially into longer-wave radiation, the luminescent material being formed by particles which are coated by a coating layer, wherein a coating material for the coating layer is selected from at least one of the following groups:

alkylsilyl halides of the stoichiometry $R_2SiX_2$, wherein R=alkyl and X=Cl or Br;

arylsilyl halides of the stoichiometry $Ar_3SiX$ or $Ar_2SiX_2$, wherein Ar=phenyl and X=halogen;

phenyl-substituted silicon alkoxides;

alkyl halides of the type R—X, wherein R=aliphatic residue and X=halogen; and acyl halides of the type

wherein R=aliphatic residue and X=halogen.

2. The light-emitting device as claimed in claim 1, wherein the coating layer has a thickness of at most 5 nm.

3. The light-emitting device as claimed in claim 2, wherein the coating layer has a thickness of less than or equal to 3 nm.

4. The light-emitting device as claimed in claim 1, wherein the luminescent material is selected from the group: garnets, chlorosilicates, thiogallates and aluminates, nitridosilicates and vanadates.

5. The light-emitting device as claimed in claim 4, wherein the luminescent material contains rare earth metals as constituents.

6. The light-emitting device as claimed in claim 2, wherein the coating layer thickness is between 0.1 and 2 nm.

7. The light-emitting device as claimed in claim 2, wherein a second layer of flame-hydrolytically produced metal oxides is applied to the coating layer.

8. The light-emitting device as claimed in claim 1, wherein the radiation source is a UV-emitting LED, which emits with a peak wavelength in the range from 300 to 420 nm.

9. The light-emitting device as claimed in claim 1, wherein the radiation source is a blue-emitting LED, which emits with a peak wavelength in the range of from 425 to 490 nm.

10. The light-emitting device as claimed in claim 1, wherein the radiation source is a high-pressure discharge lamp, which emits essentially in the range of from 200 to 490 nm.

11. The light-emitting device as claimed in claim 1, wherein the radiation source is an excimer discharge device, which emits essentially in the range of from 150 to 320 nm.

12. The light-emitting device as claimed in claim 1, wherein in R—X, X=Cl or Br.

13. The light-emitting device as claimed in claim 1, wherein in

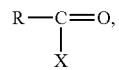

X=Cl or Br.

* * * * *